United States Patent
Certenais

[11] Patent Number: 5,570,023
[45] Date of Patent: Oct. 29, 1996

[54] PORTABLE STATION FOR MEASURING AND ADJUSTING THE MAGNETIC SIGNATURE OF A NAVAL SHIP

[75] Inventor: Joël Certenais, Lesneven, France

[73] Assignee: Thomson-CSF, Paris, France

[21] Appl. No.: 178,332

[22] PCT Filed: Jul. 21, 1992

[86] PCT No.: PCT/FR92/00714

§ 371 Date: Jan. 14, 1994

§ 102(e) Date: Jan. 14, 1994

[87] PCT Pub. No.: WO93/01971

PCT Pub. Date: Feb. 4, 1993

[30] Foreign Application Priority Data

Jul. 23, 1991 [FR] France ..................... 91 09277

[51] Int. Cl.$^6$ ................. B63G 9/06; H01F 13/00; G01V 3/08; G01R 33/02
[52] U.S. Cl. .................. 324/345; 324/244; 324/326; 361/149
[58] Field of Search .................. 324/225, 226, 324/244, 345, 247, 260; 364/449; 361/143, 149, 267; 114/15, 240 R

[56] References Cited

U.S. PATENT DOCUMENTS

| | | | |
|---|---|---|---|
| 4,292,590 | 9/1981 | Wilson | 324/345 |
| 4,808,923 | 2/1989 | Posseme | 324/244 X |
| 4,812,759 | 3/1989 | Duthoit | 324/244 X |

Primary Examiner—Sandra L. O'Shea
Assistant Examiner—Jay M. Patidar
Attorney, Agent, or Firm—Oblon, Spivak, McClelland, Maier & Neustadt, P.C.

[57] ABSTRACT

The invention relates to a portable station for measuring and adjusting the magnetic signature of a naval ship making it possible to determine and/or modify the characteristics of the currents flowing in the magnetic immunization loops with which this naval ship (1) is furnished. The station is of the type including several magnetic sensors (4) capable of being laid on the bottom of the sea, the magnetic sensors (4) being connected to a device (13) for relaying the data which they provide, and the said naval ship (1) being equipped with a device (14) for receiving the said data, and is characterized in that the magnetic sensors (4) are connected together so as to form a deformable string (2) capable of being laid on the bottom of the sea.

17 Claims, 2 Drawing Sheets

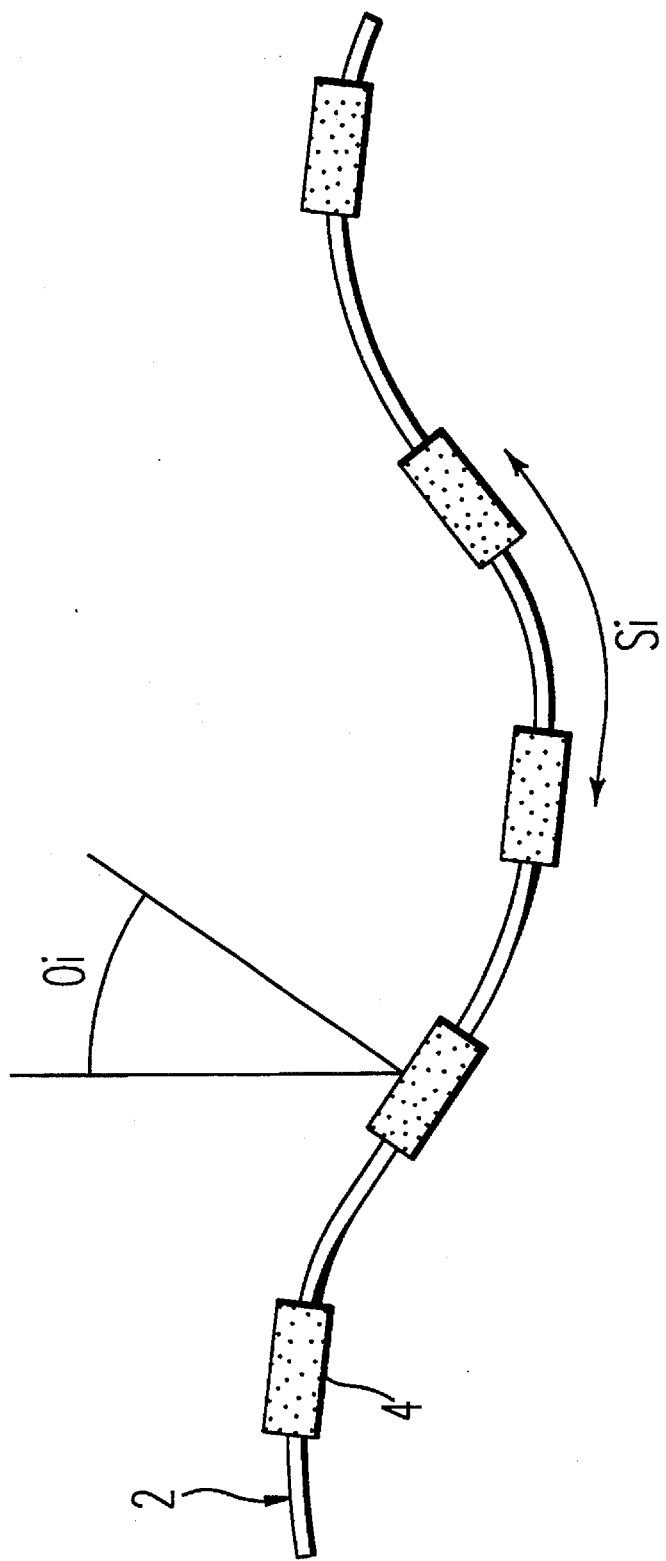

PORTABLE STATION FOR MEASURING AND ADJUSTING THE MAGNETIC SIGNATURE OF A NAVAL SHIP

BACKGROUND OF THE INVENTION

The invention relates to a portable station for measuring and adjusting the magnetic signature of a naval ship making it possible to determine and/or modify the characteristics of the currents flowing in the magnetic immunization loops with which this naval ship is furnished.

DISCUSSION OF BACKGROUND

It is known that the presence of ferromagnetic materials in a naval ship renders the latter detectable by means for detecting its "magnetic signature". These means of detection can for example be incorporated within mines or be carried by aircraft. In the latter case, the risk associated with the detection of the magnetic signature of the naval ship is called the M.A.D. (Magnetic Anomaly Detection) risk.

The magnetic signature of a ship consists of its permanent magnetization and its induced magnetization. The permanent magnetization is due to the ferromagnetic materials involved in the construction of the ship and is substantially constant. On the other hand, the induced magnetization is essentially variable and, in the case of a vessel, depends on its orientation in the earth's magnetic field, its heading and its inclination due to roll and pitch.

The magnetic signature of the ship therefore makes it possible to locate and track it, and possibly to guide or fire missiles intended to destroy it. It is therefore very important to minimize or even cancel this magnetic signature in order to prevent its detection by a magnetic method.

This magnetic immunization operation is performed by creating in the volume of the ship a magnetic field which compensates that of the ship, so as to cancel its magnetic signature. To do this, the ship is equipped with a set of circuits termed immunization loops, round which an electric current circulates.

The dimensions and arrangement of the loops and the currents flowing in them are determined so as to minimize, as far as possible, the "magnetic signature" of the ship, regardless of its orientation in the earth's magnetic field, that is to say regardless of its heading and inclination due to roll and pitch. These immunization loops are distributed in three directions corresponding to the axes of roll, yaw and pitch.

The currents in the immunization loops are adjusted with the help of a measurement station. Conventionally, the measurement stations consist of two linear arrays of magnetic sensors arranged on the bottom of the sea, one installed in a North-South direction and the other in an East-West direction, for example. These arrays of magnetic sensors are connected by cables to a station installed on land which analyses the measurements made so as to determine the characteristics of the currents to be made to flow in the various loops.

The total magnetization (permanent+induced) can be written:

$$P_L + P_V + P_T + I_V + I_L \cos\alpha + I_T \sin\alpha$$

where: P is the permanent magnetization,
I is the induced magnetization,
L, V and T are the three axes along which the immunization loops are arranged,
α represents the magnetic heading of the vessel.

These various components of the permanent magnetization and of the induced magnetization of a naval ship are produced with the help of such a measurement station by making the naval ship travel the same track twice above the arrays of magnetic sensors, following two opposite headings.

The permanent magnetization, ship-related, changes with the latter's motion, whereas the induced magnetization does not change. In order to ascertain the induced magnetization it suffices to subtract the measurement results in the two opposite directions. Then, knowing the induced magnetization and the total magnetization, the permanent magnetization is obtained directly. Thus, a North-South and then South-North pass enables $I_L$ to be determined and an East-West and then West-East pass enables $I_T$ to be calculated.

However, this method of measurement does not enable $I_V$ to be determined.

Indeed, the vertical induced magnetization cannot be determined from measurements made at a single latitude. This component is in fact dependent on the variation in the vertical component of the earth's magnetic field. Since stations for measuring the magnetization of naval ships are not available at all latitudes, determination of the vertical induced magnetization is then carried out by employing empirical methods. One of these methods, used in the majority of cases, consists in regarding the vertical induced magnetization as representing a certain fixed percentage of the vertical total magnetization measured in a given spot. However, these empirical methods do not enable the vertical induced magnetization to be determined accurately, this having the consequence of lowering the quality of the magnetic compensation calculated from the various components of the ship's magnetization.

Furthermore, during a lengthy operation, the magnetic signature of a naval ship degrades over time. This degradation is due in particular to the permanent vibrations to which the naval ship is subjected, relative to the earth's magnetic field. The characteristics of the electric currents flowing in the immunization loops and which were initially determined by a land station no longer enable the magnetic signature of the naval ship to be compensated satisfactorily after a certain time. It is therefore necessary to be able periodically to recalculate the value of the currents which should flow in the immunization loops.

These various problems have prompted the appearance of transportable magnetic measuring stations which can be carried on board the vessel and make it possible in particular to calculate the various components of the magnetization of a naval ship in accordance with its geographical position, for example in its port of departure, then at its port of arrival, at another latitude.

Of course, these transportable stations must comprise not only an on-board measuring and calculating unit, but also a system of sensors which can be deployed around the vessel.

The earliest transportable stations for measuring the magnetic signature of naval ships possess a layout which is identical to the fixed stations, the land units being easily removable so as to be transportable. The cost of such stations and of their implementation is obviously high.

Patent application WO 87/02324 proposes a transportable magnetic measuring station which includes two magnetometers capable of being placed on the bottom of the sea and each connected to a surface radio buoy relaying to the naval ship the data gathered by the magnetometers.

According to this patent, the two magnetometers must be separated by a distance equal to at least twice the height of water corresponding to the depth at which they are laid. The data are acquired by maneuvering the naval ship along an axis perpendicular to the axis connecting the two magnetometers and equidistant from them with a constant speed preferably corresponding to the vessel's maximum speed.

Since portable stations of this type include only two sensors, the associated magnetic compensation is rather inaccurate. Indeed, this small number of sensors does not allow the acquisition of a sufficient number of parameters to refine the calculation of the various components of the ship's magnetization.

Moreover, it is difficult to employ this portable station since the use of one buoy per magnetometer is advised and since the relative position of the magnetometers used must be known to within 1%. The quality of the magnetic compensation effected is appreciably less than the quality obtained with the help of land measuring stations.

SUMMARY OF THE INVENTION

The invention proposes to overcome these various drawbacks of the state of the art.

More precisely, an object of the present invention is to provide a portable station for measuring the magnetic signature of a naval ship making it possible to provide results equivalent to the results obtained with the help of fixed land magnetic measuring stations.

In particular, an object of the invention is to propose a portable measuring and adjusting station capable of being deployed rapidly.

Another object of the invention is to provide a portable station capable of being recovered easily and rapidly after it has been employed.

A further object of the invention is to propose a portable station making it possible not only to measure and adjust the magnetic signature of the naval ship but capable optionally of being used to evaluate its under-pressure signature and/or its acoustic signature.

Another object of the invention is to propose a process for implementing such a portable station.

According to the invention, the portable station for measuring and adjusting the magnetic signature of a naval ship and intended for determining the currents to be made to flow in the magnetic immunization loops with which this ship is equipped is of the type comprising several magnetic sensors capable of being laid on the bottom of the sea, the said magnetic sensors being connected to means of relaying the data which they provide, and the said naval ship being equipped with means of receiving and analyzing the said data.

The portable station for measuring and adjusting the magnetic signature of a naval ship according to the invention is characterized in that the said magnetic sensors are connected together so as to form a deformable string capable of being laid on the bottom of the sea. In this way the magnetic sensors may be arranged in a single operation, this having the effect of curtailing the time required to deploy the station.

Preferably, the said string also comprises water-height sensors. These sensors allow exact determination of the depth at which the said string is positioned.

According to a particularly significant embodiment of the present invention, the said water-height sensors consist of pressure sensors. Using pressure sensors in the guise of water-height sensors has the significance of being able to provide parameters which are also capable of being used to evaluate the under-pressure signature of the ship.

Advantageously, the number of water-height sensors is equal to the number of magnetic sensors.

Preferably, the said magnetic sensors are arranged along the said string according to a regular spacing.

Also preferably, the said spacing between two sensors corresponds roughly to the water depth at which the said string is liable to be laid.

According to a particularly significant embodiment, the said string is connected to a single surface buoy fitted with the said means of relaying the data provided by the magnetic sensors to the said means of receiving and analyzing the said data, situated on the said naval ship.

Preferably, the said string is connected to the said buoy by a cable equipped with ballast means, the said string being joined to the said cable at a junction point situated above the ballast means, releasing means being positioned between the said ballast means and the said junction point. This arrangement makes it possible to be able to recover the said string without having to raise the said ballast means.

So as to further facilitate the recovery of the said string, the said releasing means are remotely controllable.

Preferably, the said remotely controllable casting-off means consist of an explosive shackle.

Although the fixing of just two, three or four magnetic sensors along the said string could be envisaged, the number of magnetic sensors is advantageously equal to at least five. It is in fact on the number of parameters acquired by the various magnetic sensors that the quality of the magnetic compensation of the naval ship will depend.

Also advantageously, the said magnetic sensors consist of triaxial magnetometers hung on two spindles. This type of magnetometer has a single stable core per measurement axis.

According to a complementary variant, the said string also comprises acoustic sensors. This last characteristic makes it possible to obtain a station combining the magnetic signature of a naval ship and its acoustic signature since the said acoustic sensors make it possible to obtain data relating to the noise radiated by the presence and/or the maneuvering of the said naval ship.

Advantageously, the said string consists of a sheath inside which are arranged the various sensors, the latter being connected to load take-up cables.

The invention also relates to a process for measuring and adjusting the magnetic signature of a naval ship, for the implementation of the portable station according to the invention.

The process is characterized in that it comprises the steps consisting in:

deploying the said string on the bottom of the sea;

evaluating the deflection of the said string so as to ascertain the relative position of the said magnetic sensors;

determining the positioning of the said naval ship with respect to the said string;

determining the path of the naval ship;

gathering the data provided by the said magnetic sensors of the said string during at least one pass of the said naval ship along the said path.

Preferably, the step consisting in evaluating the deflection of the said string consists in:

determining the deflection of the said string in the vertical plane by using the data provided by the water-height sensors;

determining the deflection of the said string in the horizontal plane by using a method of interpolation employing the curvilinear coordinates Si of the magnetic sensors on the one hand and the angles θi which the latter make with magnetic north on the other hand.

The curvilinear coordinates Si of the magnetic sensors corresponding to the distance existing between the various magnetic sensors in the string.

Advantageously, angles θi are obtained from the values of the components Hx, Hy of the earth's magnetic field in the horizontal plane through the formula:

$$\theta i = \arctan \frac{Hx}{Hy}$$

the naval ship being retreated sufficiently far from the said string as to not have any influence on the values of the components Hx and Hy.

Also preferably, the step consisting in determining the positioning of the said naval ship relative to the said string consists in particular in calculating, based on the z data from the water-height sensors, the second derivative of the magnetic field $$\frac{\delta^2 Bz}{\delta z^2}$$

and in searching for the level curve $$\frac{\delta^2 Bz}{\delta z^2} = 0$$

The determination of the positioning of the naval ship relative to the string is next refined by a "tracking" method. This step can be performed for example with the aid of optical, acoustic or even magnetic aiming means. Preferably, this step is performed by equipping the ship with laser reflectors, an external system following on land the positioning of these reflectors.

BRIEF DESCRIPTION OF THE DRAWINGS

The invention, together with the various advantages which it offers, will be more readily understood with the help of the description which will follow of a non-limiting illustrative embodiment of the invention referring to the drawings in which:

FIG. 3 represents a schematic view in elevation of the string of the portable station.

DETAILED DESCRIPTION OF THE PREFERRED EMBODIMENT

Figure 1:
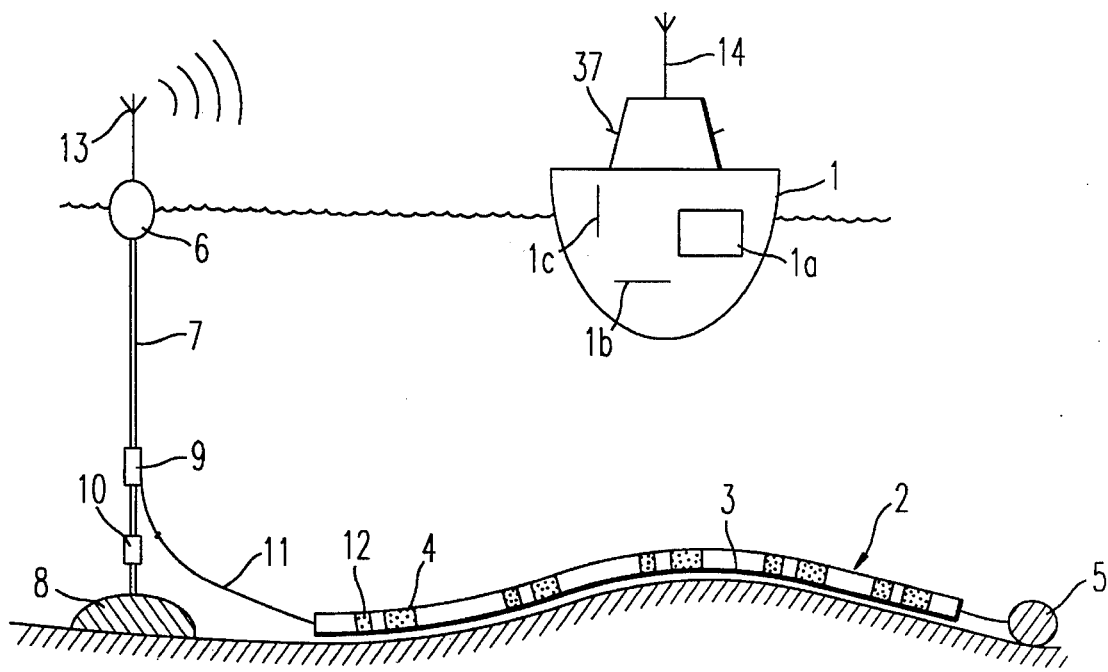
FIG. 1 represents a naval ship in proximity to a portable station for measuring and adjusting its magnetic signature, the said station being deployed.

According to FIG. 1, a naval ship 1 is operating in an environment liable to offer a risk of detection of its magnetic signature. The naval ship has several magnetic immunization loops 1a, 1b, 1c, arranged in three distinct planes. Some of these loops 1a are intended for compensating the longitudinal magnetization of the ship, others 1b for compensating its vertical magnetization, and others 1c for compensating its transverse magnetization. Electric currents aimed at minimizing as far as possible the magnetic signature of the ship flow in these loops. The naval ship having just performed a lengthy operation, its magnetic signature has been modified and the value of the electric currents flowing in its immunization loops must be modified accordingly.

For the purpose of proceeding with this operation, a portable station for measuring and adjusting the magnetic signature of the naval ship 1 is deployed in proximity to the latter. This portable measuring station comprises a deformable string 2 consisting of a sheath 3 inside which are arranged magnetometers 4. There are five of these magnetometers 4 and they are arranged along the string 2 in a regular spacing of the order of two thirds of the water height. For example, for a bottom 20 m deep, the spacing is 12 m. In this case, the length of the string is around 48 m. The deformable string 2 is furthermore equipped with water-height sensors 12 consisting of the same number of pressure sensors as the number of magnetometers 4. Each pressure sensor 12 is positioned in proximity to a magnetometer 4.

Inside the sheath 3, the various sensors, magnetometers 4 and pressure sensors 12 are connected together by load take-up cables.

The deformable string 2 is furthermore equipped at one of its ends with a ballast 5 facilitating its deployment. This deformable string 2 is connected to a surface buoy 6 by a cable 7 equipped with ballast means 8 consisting of a kentledge. The buoy 6 is furthermore equipped with means 13 for relaying the data provided by the magnetometers 4 on the one hand and by the pressure sensors 12 on the other hand. The naval ship is consequently rigged with means 14 for receiving these data. The string 2 is connected to the cable 7, with the help of a connecting cable 11, at a junction point 9. The length of the connecting cable 11 is calculated as a function of depth so as to allow the submersion of the kentledge 8 when the string 2 is almost fully laid on the bottom of the sea.

Casting-off means 10 consisting of a remotely controllable explosive shackle are positioned between the kentledge 8 and the junction point 9.

During deployment of the portable station, the string 2 is put into the water with the help of for example a raft. The end furnished with the ballast 5 is submerged first so as to allow the unravelling of the string 2 and its progressive positioning on the bottom.

When the kentledge 8 touches the bottom of the sea, the cable 7, whose length is devised for this purpose, is tensioned such as to permit relative immobility of the surface buoy 6.

Figure 2:
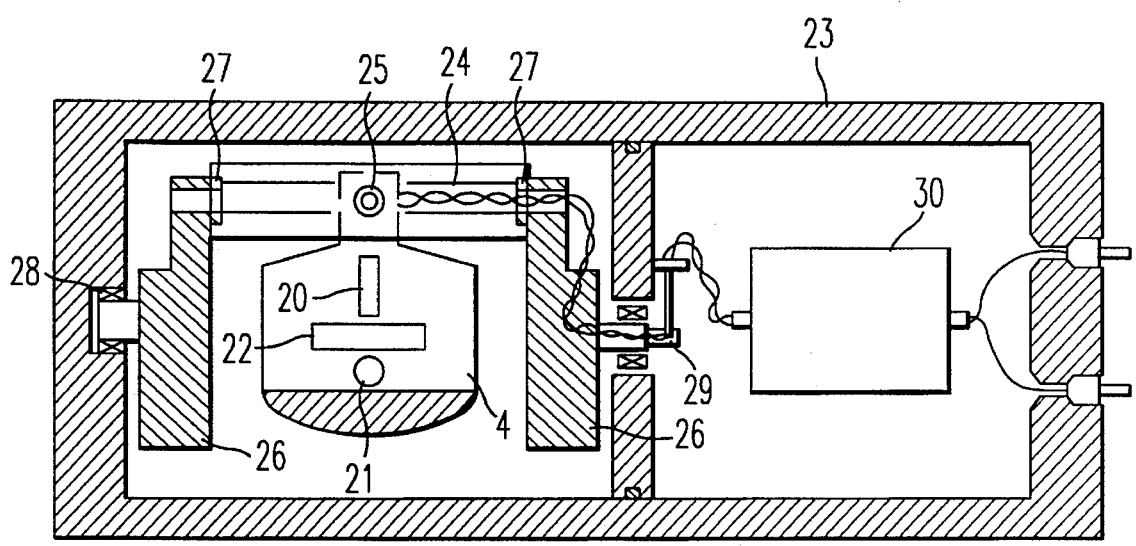
FIG. 2 represents a sectional view of a hung triaxial magnetometer capable of being used in the context of the embodying of the portable station according to the invention.

According to FIG. 2, the magnetometers 4 used within the construction of the deformable string 2 are flow-valve triaxial magnetometers hung on gimbals.

This type of magnetometer includes just a single saturable core per measurement axis and consists of a vertical probe 20, a transverse probe 21 and a longitudinal probe 22. Each magnetometer is placed in a container 23 and is hung on gimbals so as to keep it vertical.

The hanging system is obtained by connecting the magnetometer 4 to a transverse spindle 24, the transverse hanging of the magnetometer 4 being made possible with the help of a ball bearing 25.

The longitudinal hanging of the magnetometer is obtained by mounting the said longitudinal spindle 24 on two pendulums 26 equipped with ball bearings 27. The pendulums 26 are themselves mounted rotationally in the container 23 with the help of ball bearings 28.

The data gathered by the various probes 20, 21, 22 of the magnetometer 4 are relayed to an electronic device 30 also situated inside the container 23 with the help of a revolving commutator 29.

All the elements making up the deformable string are constructed from non-magnetic materials so as to have no influence on the parameters registered by the magnetometers.

In order to interpret correctly the data relayed by the magnetometers 4 and the pressure sensors 12 of the string 2, it is necessary to ascertain the shape of the string when it is moored on the bottom.

According to FIG. 3, the string 2 rests on the bottom of the sea. The five magnetometers 4 are separated from one another by a spacing Si and make angles θi with magnetic north.

The deflection of the string 2 in the vertical plane is given directly by the pressure sensors 12, the pressure recorded by them being proportional to the depth z at which they are positioned.

The deflection in the horizontal plane is obtained using a method of interpolation, for example the SPLINE method, with the aid of the curvilinear coordinates Si of the magnetometers and with the aid of the angles θi made by the latter with the horizontal plane. The angles θi are obtained from the components Hx and Hy of the magnetic field through the formula:

$$\theta i = \arctan \frac{Hx}{Hy}$$

In order to evaluate these angles θi correctly, the naval ship is temporarily retreated so as to have no influence on the data provided by the magnetometers 4.

When the shape of the string is determined, the positioning of the naval ship relative to the string is evaluated with the help of the z data provided by the pressure sensors 12, by calculating the second derivative $$\frac{\delta^2 Bz}{\delta z^2}$$

of the magnetic field and by searching for the level curve $$\frac{\delta^2 Bz}{\delta z^2} = 0$$

The positioning of the ship is next refined with the help of a "tracking" method using laser reflectors 37 situated on the ship, a land system making it possible to pinpoint these reflectors.

When the deflection of the string 2 and the positioning of the ship 1 are known, the path of the ship is determined.

The data provided by the magnetometers are then gathered during at least one pass of the ship 1 along the determined path. These data make it possible to evaluate the magnetic signature of the ship and optionally to modify the currents flowing in the immunization loops so as to reset it.

Having completed the operation, the exploding of the shackle 10 can be remotely controlled so as to bring about the releasing of the string 2. The latter can be recovered with the help of the buoy 6.

I claim:

1. A portable station for measuring the magnetic signature of a naval ship by determining the characteristics of currents made to flow in magnetic immunization loops of said ship, said station comprising: a set of magnetic sensors laid on the bottom of a sea and a set of water-height sensors each respectively associated with a respective one of said set of magnetic sensors, said set of magnetic sensors each including a triaxial magnetometer hung on gimbals and each one of said set of magnetic sensors being connected, along with each one of said set of water-height sensors, to a means for relaying data provided by said magnetic and water-height sensors, said naval ship being equipped with a means for receiving said data and said set of magnetic sensors and said set of water-height sensors being arranged inside a deformable flexible sheath to form a deformable string laid on the bottom of the sea.

2. The station according to claim 1 wherein said water-height sensors consist of pressure sensors.

3. The station according to claim 2 wherein a number of said water-height sensors is equal to a number of magnetic sensors.

4. The station according to one of claims 1, 2 and 3 wherein said magnetic sensors are arranged along said string according to a regular spacing.

5. The station according to claim 4 wherein said regular spacing is not substantially greater than said water depth at which said string is to be laid.

6. The station according to claim 1 wherein said string is connected to a single surface buoy fitted with said means for relaying data provided by said sensors to said means for receiving said data.

7. The station according to claim 6 wherein said string is connected to said buoy by a cable equipped with a ballast means, said string being joined to said cable at a junction point situated above said ballast means, casting-off means being positioned between said ballast means and said junction point.

8. The station according to claim 7 wherein said casting-off means are remotely controlled.

9. The station according to claim 8 wherein said remotely controllable casting-off means is an explosive shackle.

10. The station according to claim 1 wherein said number of magnetic sensors is at least five.

11. The station according to claim 1 wherein said string further includes acoustic sensors.

12. A process for measuring the magnetic signature of a naval ship, comprising the steps of:

deploying a deformable a string formed of a set of magnetic sensors and a set of water-height sensors arranged inside a deformable flexible sheath on the bottom of a sea;

evaluating a shape of said string so as to ascertain a relative position of said magnetic sensors;

determining a positioning of said naval ship with respect to said string;

determining a path of said naval ship;

gathering data provided by said magnetic sensors of said string during at least one pass of said naval ship along said path.

13. A process according to claim 6 wherein the step of evaluating said shape of said string comprises the steps of:

determining said shape of said string in a vertical plane by using data provided by said water-height sensors;

determining a shape of said string in a horizontal plane by using a method of interpolation employing curvilinear coordinates Si of the magnetic sensors and angles θi which said sensors make with magnetic north.

14. A process according to claim 13 wherein angles θi are obtained from the values of the components Hx, Hy of the magnetic field in the horizontal plane by the formula:

$\theta_i = \arctan Hx/Hy$ the naval ship being spaced sufficiently distant from said strings so as not to have any influence on the values of said components Hx and Hy.

15. A process according to one of claims 12, 13, 14 wherein the step of determining positioning of said naval ship relative to said string consists in particular in calculating, based on the data from the water-height sensors, the second derivative of the magnetic field $$\frac{\delta^2 B_z}{\delta z^2}$$

and in searching for the level curve $$\frac{\delta^2 B_z}{\delta z^2} = 0$$

16. A process according to claim 12 wherein the step of determining the positioning of the naval ship is refined by a method of one of magnetic, acoustic and optical tracking.

17. A process according to claim 16 wherein said method of tracking includes the use of laser reflectors on said naval ship and a land-based system wherein said land-based system precisely locates said reflectors.

\* \* \* \* \*